(12) United States Patent
Wang et al.

(10) Patent No.: US 7,400,159 B2
(45) Date of Patent: Jul. 15, 2008

(54) INTEGRATED COMPLEX NANO PROBE CARD AND METHOD OF MAKING SAME

(75) Inventors: Horng-Jee Wang, Taipei (TW); Ya-Ru Huang, Taipei (TW); Min-Chieh Chou, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 551 days.

(21) Appl. No.: 10/393,262

(22) Filed: Mar. 21, 2003

(65) Prior Publication Data

US 2004/0106218 A1    Jun. 3, 2004

(30) Foreign Application Priority Data

Nov. 29, 2002    (TW) .............................. 91134713 A

(51) Int. Cl.
G01R 31/02    (2006.01)

(52) U.S. Cl. ..................... 324/761; 324/158.1

(58) Field of Classification Search ................ 324/761, 324/754, 158.1; 423/447.3, 439, 447.5, 447.2; 73/105; 250/306, 307; 436/164, 171, 524, 436/528, 526
See application file for complete search history.

(56) References Cited

U.S. PATENT DOCUMENTS

| | | | | |
|---|---|---|---|---|
| 557,148 | A * | 3/1896 | Loeb et al. ..................... 52/455 |
| 6,129,901 | A * | 10/2000 | Moskovits et al. ........ 423/447.3 |
| 6,185,961 | B1 * | 2/2001 | Tonucci et al. ................ 65/60.4 |
| 6,188,582 | B1 * | 2/2001 | Peter ........................... 361/760 |
| 6,232,706 | B1 * | 5/2001 | Dai et al. ..................... 313/309 |
| 6,340,822 | B1 * | 1/2002 | Brown et al. ..................... 257/25 |
| 6,346,023 | B1 * | 2/2002 | Tsuboi et al. .................. 445/46 |
| 6,401,526 | B1 * | 6/2002 | Dai et al. ....................... 73/105 |
| 6,689,439 | B2 * | 2/2004 | Sobolewski ................. 428/36.9 |
| 6,692,327 | B1 * | 2/2004 | Deguchi et al. ............... 445/49 |
| 6,727,720 | B2 * | 4/2004 | Houge et al. ................. 324/761 |
| 6,741,019 | B1 * | 5/2004 | Filas et al. .................... 313/355 |
| 6,821,625 | B2 * | 11/2004 | Chu et al. ..................... 428/408 |
| 6,831,017 | B1 * | 12/2004 | Li et al. ........................ 438/694 |
| 6,855,603 | B2 * | 2/2005 | Choi et al. .................... 438/268 |
| 6,864,162 | B2 * | 3/2005 | Jin ............................... 438/551 |
| 6,884,707 | B1 * | 4/2005 | Cherian ....................... 438/611 |
| 6,989,325 | B2 * | 1/2006 | Uang et al. .................. 438/613 |
| 7,012,441 | B2 * | 3/2006 | Chou et al. .................. 324/754 |
| 7,189,435 | B2 * | 3/2007 | Tuominen et al. ........... 427/472 |
| 7,190,049 | B2 * | 3/2007 | Tuominen et al. ........... 257/618 |
| 2004/0072994 | A1 * | 4/2004 | Herr et al. .................... 530/350 |
| 2006/0290343 | A1 * | 12/2006 | Crafts et al. ............. 324/158.1 |

* cited by examiner

*Primary Examiner*—Paresh Patel
(74) *Attorney, Agent, or Firm*—Bacon & Thomas PLLC

(57) ABSTRACT

An integrated complex nano probe card is disclosed to include a substrate layer having a front side and a back side, and complex probe pins arranged in the substrate layer. Each complex probe pin has a bundle of aligned parallel nanotubes/nanorods and a bonding material bonded to the bundle of aligned parallel nanotubes/nanorods and filled in gaps in the nanotubes/nanorods. Each complex probe pin has a base end exposed on the back side of the substrate layer and a distal end spaced above the front side of the substrate layer.

5 Claims, 4 Drawing Sheets

INTEGRATED COMPLEX NANO PROBE CARD AND METHOD OF MAKING SAME

BACKGROUND OF THE INVENTION

1. Field of the Invention

The present invention relates generally to a probe card for testing electronic elements and its fabrication method and, more specifically, to an integrated complex nano probe card. The invention relates also to the fabrication of the integrated complex nano probe card.

2. Description of the Related Art

A variety of probe cards for testing electrical properties of an electronic element are commercially available. These probe cards include two types, i.e., the cantilever type and the vertical type. The probe pins of these two types of probe cards are tungsten pins, lead pins, or beryllium copper pins manually installed in a printed circuit board. The pitch of the probe pins of a cantilever type probe card is about 50 µm. The pitch of the probe pins of a vertical type probe card is about 100 µm. Due to technical limitations, the pitch of the probe pins of either type of probe cards cannot be reduced as desired to fit measuring requirements for nanoelectronics. Further, because probe pins are installed in a printed circuit board manually, the manufacturing cost is relatively increased with the increasing of pin counts. This drawback causes the aforesaid conventional probe cards unable to meet future demand.

U.S. Pat. No. 6,232,706 discloses a field emission device having bundles of aligned parallel carbon nanotubes on a substrate. The carbon nanotubes are oriented perpendicular to the substrate. The bundles of carbon nanotubes extend only from regions of the substrate patterned with a catalyst material. The substrate is porous silicon. The fabrication of the field emission device starts with forming a porous layer on a silicon substrate by electrochemical etching. Then, a thin layer of iron is deposited on the porous layer in patterned regions. The iron is then oxidized into iron oxide, and then the substrate is exposed to ethylene gas at elevated temperature. The iron oxide catalyzes the formation of bundles of aligned parallel carbon nanotubes, which grow perpendicular to the substrate surface.

The advantages of U.S. Pat. No. 6,232,706 include (1) small nanotube pitch, and (2) manufacturing cost of nanotubes being not determined subject to the pin counts. However, this design still has drawbacks. Because nanotubes are not linked to one another, the whole structure is bulky, resulting in low physical and electrical properties of nanotubes. Further, due to low impact strength of carbon material, nanotubes tend to be broken when pressed by an external object. Due to the aforesaid drawbacks, nanotubes made according to U.S. Pat. No. 6,232,706 are not suitable for use as probe pins in a probe card.

Further, U.S. Pat. No. 5,903,161 discloses an electrically conductive rod-shaped single crystal product, which is a rod-shaped single crystal formed by a vapor-liquid-solid method or such a rod-shaped single crystal having its forward end alloy portion removed, and the surface of the rod-shaped single crystal is coated by an electrically conductive film. However, this rod-shaped single crystal product has a low electric conductivity due to its limited electric conducting area.

SUMMARY OF THE INVENTION

The present invention has been accomplished under the circumstances in view. It is therefore the main object of the present invention to provide a complex probe pin, which has good physical properties as well as good electrical properties. To achieve this object, the complex probe pin comprises a bundle of aligned parallel nanotubes/nanorods, and a bonding material bonded to the bundle of aligned parallel nanotubes/nanorods and filled in gaps in the nanotubes/nanorods.

It is another object of the present invention to provide a probe card having integrated complex nano probe pins, which has a small probe pin pitch and is inexpensive to manufacture. To achieve this object, the probe card comprises a substrate layer having a front side and a back side, and complex probe pins arranged in the substrate layer. Each complex probe pin is comprised of a bundle of aligned parallel nanotubes/nanorods, and a bonding material bonded to the bundle of aligned parallel nanotubes/nanorods and filled in gaps in the nanotubes/nanorods. Each complex probe pin has a base end exposed to the outside of the back side of the substrate layer, and a distal end spaced above the front side of the substrate layer.

It is still another object of the present invention to provide a probe card fabrication method, which minimizes the pitch of probe pins, improves the physical and electrical properties of probe pins, and increases pin accounts without increasing much manufacturing cost. To achieve this object, the probe card fabrication method comprises the steps of (1) preparing a substrate having a porous surface; (2) covering a catalyst material on the porous surface of the substrate subject to a predetermined pattern, so as to form a plurality of catalyst strips on the porous surface of the substrate, the catalyst strips each comprising a plurality of catalyst elements; (3) exposing the catalyst strips to an environment containing a predetermined gas and having a temperature above room temperature, for enabling the catalyst elements to react with the gas so as to form bundles of aligned parallel nanotubes/nanorods at the catalyst strips; and (4) covering the bundles of aligned parallel nanotubes/nanorods by a bonding material, enabling the bonding material to pass into gaps in the aligned parallel nanotubes/nanorods.

DETAILED DESCRIPTION OF THE INVENTION

Figure 1:
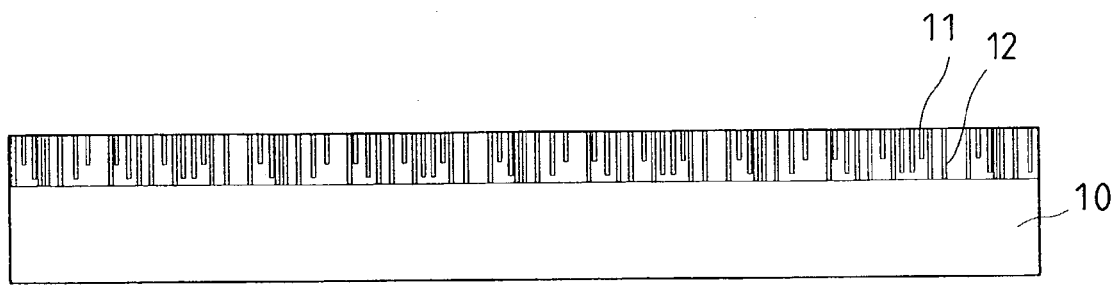
FIG. 1 is a sectional view of a finished product obtained after step (1) of the probe card fabrication method according to the present invention.

Referring to FIGS. 1~4, a probe card fabrication method includes the steps of:

(1) Prepare a p-doped n+-type si(100) substrate 10, then use hydrofluoric acid solution and platinum served as a cathode to electrochemically etch one surface 11 of the substrate 10, forming pores 12 in the surface 11, each pore 12 having a diameter below 3 nm, as shown in FIG. 1.

Figure 2:
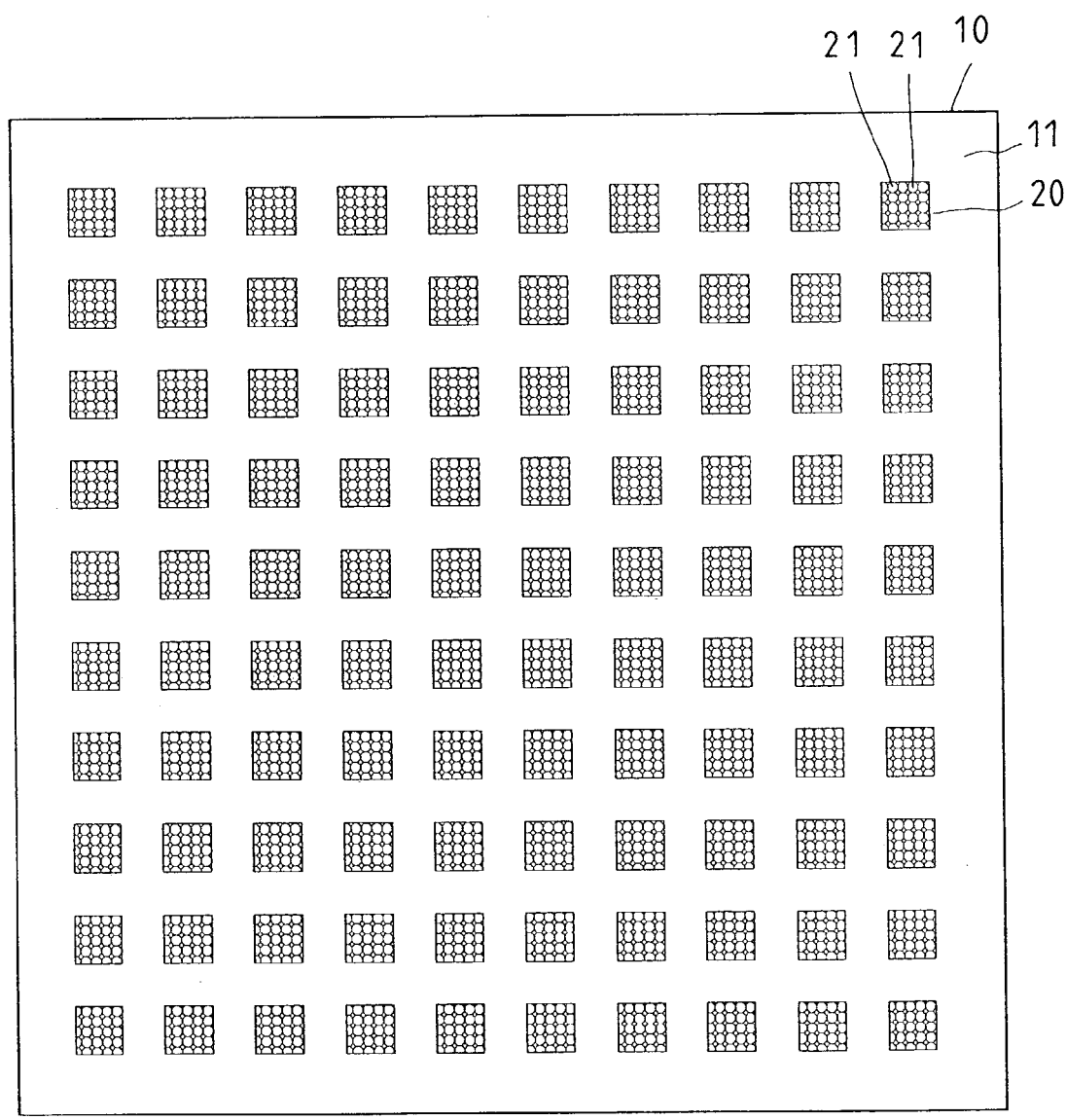
FIG. 2 is a top view of a finished product obtained after step (2) of the probe card fabrication method according to the present invention.

(2) Use lithography and evaporation techniques to cover a catalyst material, for example, iron (Fe), on the surface 11, forming a matrix of catalyst strips 20 on the surface 11, each catalyst strips 20 having densely arranged fine catalyst elements 21, as shown in FIG. 2.

Figure 3:
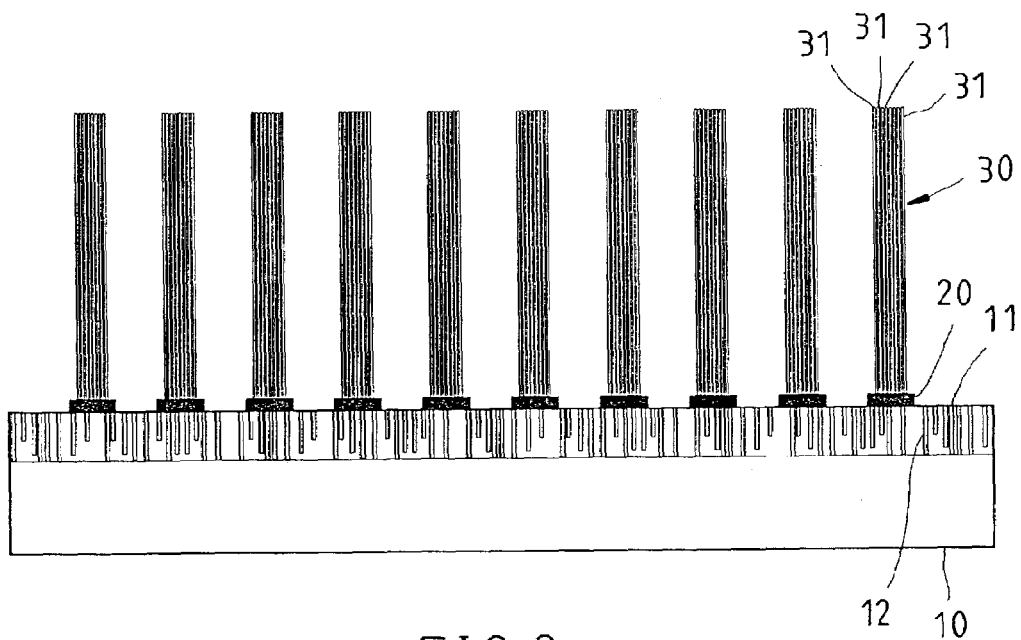
FIG. 3 is a sectional view of a finished product obtained after step (3) of the probe card fabrication method according to the present invention.

(3) Put the substrate 10 in a CVD (chemical vapor deposition) stove pipe, then increase the temperature in the stove pipe properly and supply a carbon-contained gas, for example, $C_2H_2$, causing the catalyst elements 21 to make a chemical reaction with the supplied gas, so that bundles 30 of aligned parallel carbon nanotubes 31 are crystallized and respectively formed in the catalyst strips 20 and extended in direction substantially perpendicular to the surface 11 of the substrate 10, as shown in FIG. 3.

Figure 4:
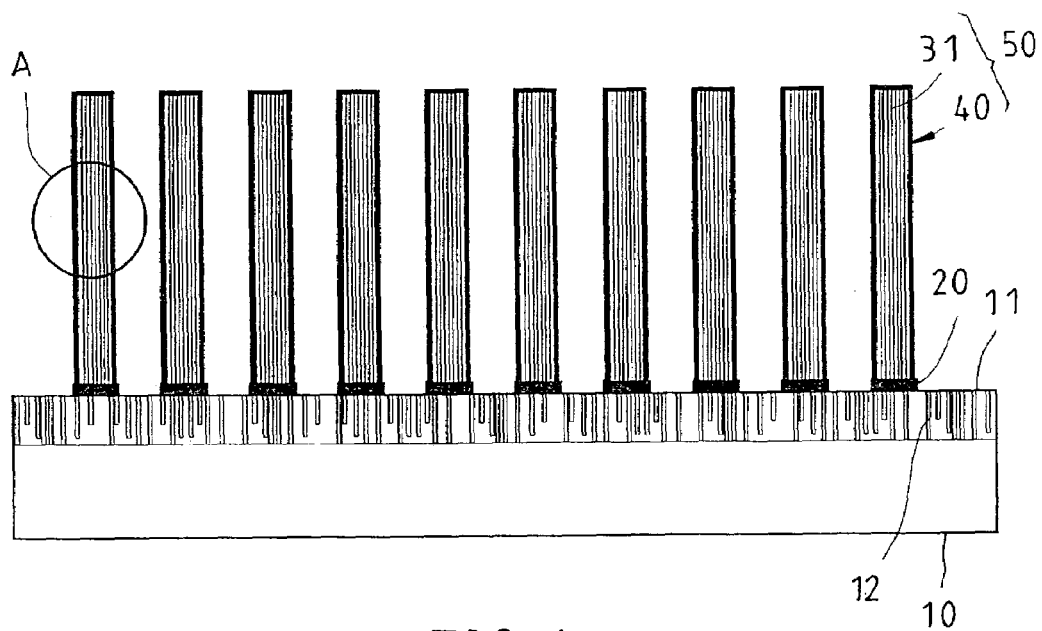
FIG. 4 is a sectional view of a finished product obtained after step (4) of the probe card fabrication method according to the present invention.

(4) Cover the bundles 30 by a bonding material, for enabling the applied bonding material to pass into gaps in carbon nanotubes 31. According to this embodiment, a metal material of good electrical properties and mechanical properties, for example, copper 40 is covered on the bundles 30 by electroplating, enabling copper 40 to pass into gaps in carbon nanotubes 31 of each bundle 30, forming complex probe pins 50 on the substrate 10, as shown in FIG. 4.

Figure 5:
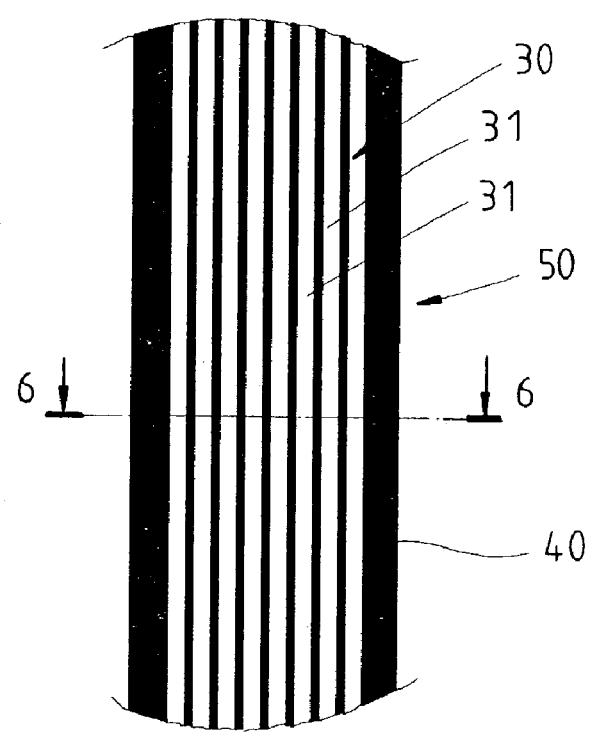
FIG. 5 is an enlarged view of part A of FIG. 4.
Figure 6:
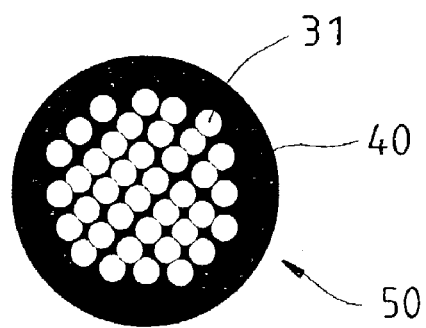
FIG. 6 is a sectional view taken along line 6-6 of FIG. 5.

With reference to FIGS. 5 and 6, the compound probe pin 50 made subject to the aforesaid method comprises a bundle 30 of substantially aligned parallel carbon nanotubes 31 and a metal material 40 covered on the bundle 30 (see FIG. 5) and filled up the gaps in the carbon nanotubes 31 (see FIG. 6). Because the bundle 30 is covered by the metal material 40 and the carbon nanotubes 31 are fixedly fastened to one another by the metal material 40, the compound probe pin 50 has a dense structure, and good mechanical, physical and electrical properties. Rubber may be used as the bonding material.

After the aforesaid four steps, each complex probe pin 50 has a base end and a distal end. The base end is fixedly connected to the surface 11 of the substrate 10 by one catalyst strip 20.

Figure 7:
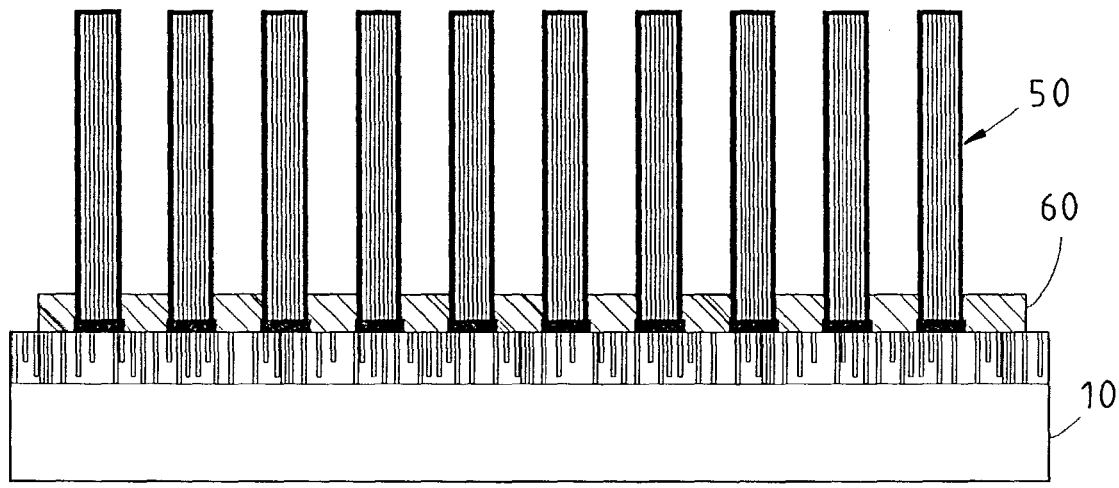
FIG. 7 is a sectional view of a finished product obtained after step (5) of the probe card fabrication method according to the present invention.
Figure 8:
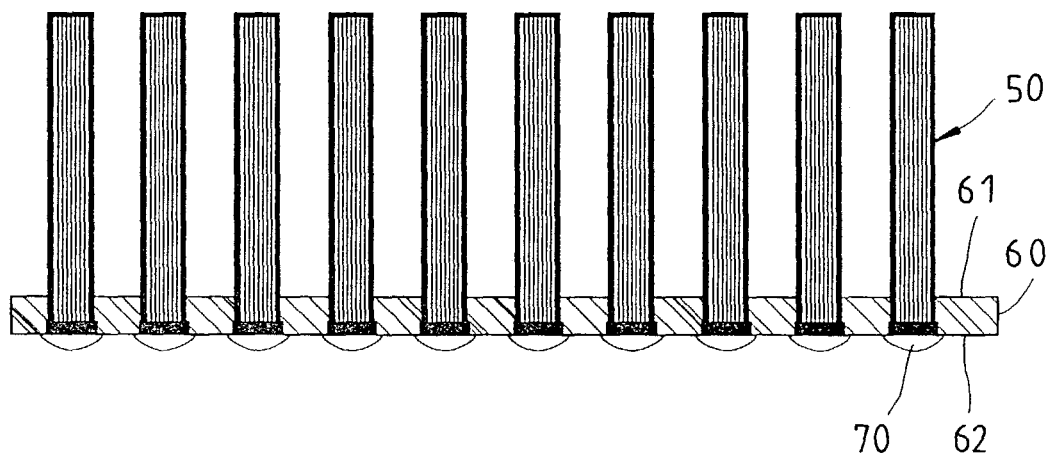
FIG. 8 is a sectional view of a finished product obtained after step (6) of the probe card fabrication method according to the present invention.

With reference to FIGS. 7 and 8, after the aforesaid four steps, it proceeds to the following steps:

(5) Apply a layer of liquid epoxy resin to the surface 11 of the substrate 10, enabling the layer of liquid epoxy resin to cover the base ends of the complex probe pins 50 and to form a substrate layer 60 when hardened as shown in FIG. 7.

(6) Remove the substrate 10 from the substrate layer 60. At this time, the substrate layer 60 has a front side 61 and a back side 62, the base ends of the complex nano probe pins 50 are exposed out of the back side 62 of the substrate layer 60, and the distal ends of the complex nano probe pins 50 are spaced above the front side 61 of the substrate layer 60. A metal conducting block 70 is then respectively formed in the exposed base end of each complex nano probe pin 50 for connection either directly or indirectly to a printed circuit board, forming a probe card.

As indicated above, the invention uses nanotechnology to form multiple complex probe pins at a time, so that the pitch of probe pins can be greatly reduced. A probe card made according to the present invention is suitable for measuring electrical properties of nanoelectronic elements. Because multiple complex probe pins are formed at a time, it breaks the limitation that the manufacturing cost is directly proportional to pin counts, and the manufacturing cost is greatly lowered. Because complex probe pins made according to the present invention have a good structure, they provide good mechanical, physical and electrical properties.

In the aforesaid fabrication procedure, iron (Fe) and $C_2H_2$ are respectively used in step (2) and step (3). Other suitable metal materials and gases may be used. For example, when gold (Au) is used as a catalyst material, $SiCl_4+H_2$ is supplied to the stove pipe, causing formation of bundles of aligned parallel silicon nanorods, which grow perpendicular to the substrate surface.

Further, arc-discharge or laser evaporation may be used to substitute for chemical vapor deposition.

The material for bonding nanotubes/nanorods can be selected from gold, nickel, nickel alloy, silver, tungsten alloy, copper, or beryllium. Because carbon nanotubes have good electric conductivity, insulating material, for example, rubber may be used and covered on the periphery of each bundle of carbon nanotubes, leaving the top end of each bundle of carbon nanotubes exposed to the outside for electric connection.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A complex nano probe pin comprising a bundle of aligned parallel nanotubes/nanorods grown from a patterned catalyst strip on a planar substrate, and a bonding material bonded to said bundle of aligned parallel nanotubes/nanorods and filled in gaps between said nanotubes/nanorods;
   wherein said planar substrate has a porous surface; and
   wherein said bonding material covers said bundle of aligned parallel nanotubes/nanorods and fills up gaps in between said nanotubes/nanorods.

2. The complex nano probe pin as claimed in claim 1, wherein the nanotubes/nanorods of said bundle of aligned parallel nanotubes/nanorods are formed of carbon.

3. The complex nano probe pin as claimed in claim 1, wherein said bonding material is copper.

4. The complex nano probe pin as claimed in claim 1, wherein said bonding material is rubber.

5. The complex nano probe pin as claimed in claim 1, wherein said bonding material covers the periphery of said bundle of aligned parallel nanotubes/nanorods and fills up gaps in between said nanotubes/nanorods.

* * * * *